United States Patent
Fraysse et al.

(10) Patent No.: US 8,558,620 B2
(45) Date of Patent: Oct. 15, 2013

(54) RADIAL POWER AMPLIFICATION DEVICE WITH PHASE DISPERSION COMPENSATION OF THE AMPLIFICATION PATHS

(75) Inventors: Jean-Philippe Fraysse, Toulouse (FR);
Jean-Michel Denoual, Pleyben (FR);
Alain Peden, Brest (FR)

(73) Assignee: Thales, Neuilly sur Seine (FR)

( * ) Notice: Subject to any disclaimer, the term of this patent is extended or adjusted under 35 U.S.C. 154(b) by 635 days.

(21) Appl. No.: 12/809,275

(22) PCT Filed: Dec. 15, 2008

(86) PCT No.: PCT/EP2008/067546
§ 371 (c)(1),
(2), (4) Date: Jun. 18, 2010

(87) PCT Pub. No.: WO2009/077501
PCT Pub. Date: Jun. 25, 2009

(65) Prior Publication Data
US 2011/0002031 A1    Jan. 6, 2011

(30) Foreign Application Priority Data

Dec. 18, 2007  (FR) .................................... 07 08848

(51) Int. Cl.
*H03F 3/60* (2006.01)
(52) U.S. Cl.
USPC ............................ 330/286; 330/295; 333/248
(58) Field of Classification Search
USPC ............................ 330/286, 295; 333/128, 248
See application file for complete search history.

(56) References Cited

U.S. PATENT DOCUMENTS

| 4,263,568 | A | | 4/1981 | Nemit |
| 4,291,278 | A | | 9/1981 | Quine |
| 4,458,229 | A | * | 7/1984 | Landry et al. ................ 333/248 |
| 4,641,106 | A | | 2/1987 | Belohoubek et al. |
| 4,688,006 | A | * | 8/1987 | Wong et al. ................... 333/113 |
| 4,700,145 | A | | 10/1987 | Yelland et al. |
| 4,724,399 | A | * | 2/1988 | Akinaga ...................... 330/286 |
| 4,931,747 | A | | 6/1990 | Hom |
| 5,218,322 | A | | 6/1993 | Allison et al. |
| 5,736,908 | A | | 4/1998 | Alexanian et al. |

FOREIGN PATENT DOCUMENTS

WO        2006/096771 A2    9/2006

OTHER PUBLICATIONS

E. Belchoubek, et al., "30-Way Radial Power Combiner for Miniature GaAs FET Power Amplifiers", International Microwave Symposium Digest, Jun. 2, 1986, pp. 515-518, IEEE, New York, USA, XP002181723.

* cited by examiner

*Primary Examiner* — Mark Hellner
(74) *Attorney, Agent, or Firm* — Baker & Hostetler LLP

(57) ABSTRACT

A radial power combination system is provided. The system comprises a radial divider comprising ports in the form of rectangular waveguides on the periphery, a radial combiner superposed on the radial divider, comprising ports in the form of rectangular waveguides on the periphery, a first, input transition transmitting a first signal to the center of the radial divider, a second, output transition capturing the first signal amplified to the output of the radial combiner, at least two amplifying channels comprising a third, input transition capable of interacting with the guides, a fourth, output transition capable of interacting with the guides and at least one amplifier, and means for adjusting the positioning of the amplifying channels, thus making it possible to adjust the phase shift of the various channels.

14 Claims, 12 Drawing Sheets

RADIAL POWER AMPLIFICATION DEVICE WITH PHASE DISPERSION COMPENSATION OF THE AMPLIFICATION PATHS

CROSS-REFERENCE TO RELATED APPLICATIONS

This application is a National Stage of International Patent Application No. PCT/EP2008/067546, filed on Dec. 15, 2008, which claims priority to foreign Patent Application No. FR 07 08848, filed on Dec. 18, 2007, the disclosures of which are incorporated herein by reference in their entirety.

FIELD OF THE INVENTION

The present invention relates to the field of microwave amplifiers with semiconductors and more particularly power combination systems. Amongst the various combination techniques, the field of the invention is situated in the systems of radial power combinations.

Since the output power of semiconducting elements reduces with the increase in operating frequency, it is necessary to combine several individual semiconducting amplifiers in order to achieve the output powers required by certain applications such as telemetry transmitters of high bit rate instruments of satellites for example.

BACKGROUND OF THE INVENTION

Nowadays, the power combination systems used in the space field are not suitable for really effectively combining more than 4 individual amplifiers at millimeter frequencies. A consequence of this limitation sometimes results in designing semiconductor components with the emphasis on output power to the detriment of the added power yield and the criticality of the designs.

Moreover, these combinations are sometimes insufficient and limiting for obtaining the output powers of SSPAS, meaning "Solid State Power Amplifiers", required for meeting the real requirements of the applications.

Power combination systems usually comprise a divider, an amplifier and a combiner making it possible to deliver an amplified output signal from an input signal. These systems usually comprise transitions making it possible to change propagation structures such as from a planar structure to a rectangular waveguide or a coaxial waveguide for example.

Today, the main power combination technologies are divided into a first power combination category called arborescent, a second power combination category called spatial and a third power combination category called radial.

The planar arborescent combination techniques make it possible to effectively combine two or four amplifiers. However, these techniques are not suitable for combining a large number of amplifiers because the increase in the number of combination stages and the lengthening of the link lines between the adders of the combiner result in very significantly degrading the signal through combination losses.

In order to minimize these combination losses, metal waveguides can be used instead of planar propagation lines. In this situation, it is then necessary to add transitions between the combiner and the individual amplifiers in order to propagate the signals between the planar lines of the individual amplifiers and the metal waveguides of the combiner. The addition of these transitions and above all the size of the metal waveguides used results in a considerable space requirement for this type of combiner. It is therefore not suitable for combining a large number of amplifiers.

The arborescent combinations as shown in FIG. 1 usually comprise a divider 1 making it possible to divide an input signal 5 into various amplifying channels 2. The various amplified signals leaving the amplifying channels can be propagated and combined in various binary adder stages in a rectangular waveguide 4, 4', 4" from a transition 3. An amplified and combined signal 6 can then be processed downstream.

Spatial combination techniques such as the solution developed in U.S. Pat. No. 5,736,908 are characterized in that the amplification device comprises several amplifying channels, usually in the form of plates, which are superposed. The input signal is spread over the amplifying channels by virtue of the spatial distribution of the energy of the signal and is recombined at the output once it has been amplified according to the same principle. These techniques have several drawbacks.

The first drawback is the result of a combination of many amplifiers with this technique. It is then necessary to add supplementary devices in order to be able to excite and combine all the amplifying channels uniformly. Since these supplementary devices add losses, the combination effectiveness of this type of combiner is degraded.

A second drawback is the difficulty of effectively getting rid of the power dissipated by the various superposed amplifying channels. The consequence of this is that, with this type of combination technique, when many amplifiers are combined, it makes it difficult to comply with the requirements imposed by the space field on the maximum temperatures for joining components with semiconductors, which must not be exceeded.

Finally, one drawback is the relative dependency of the amplifying channels, since a failure occurring in one of the amplifying channels can greatly disrupt the general operation of the amplification device.

Radial combination techniques such as the solutions proposed in U.S. Pat. No. 4,700,145, U.S. Pat. No. 4,641,106 and U.S. Pat. No. 4,931,747 are characterized in that the amplification device comprises several amplifying channels, each being connected to the ends of two radial waveguides, the ends being situated between the divider and the combiner, and the two radial waveguides being superposed. This connection makes it possible to amplify a first signal originating from one of the ports of the first radial waveguide and to re-inject it into one of the ports of the second radial waveguide so that it is recombined with the other signals originating from the other ports of the radial waveguide of the combiner.

These techniques have many advantages, notably the reduced space requirement of the amplification device compared to a combination technique with an arborescent structure with rectangular waveguides. Moreover, another advantage is the possibility of improved control over output power reduction induced by the failure of one or more amplifying channels by improving the isolation between the amplifying channels by virtue of absorbent materials or dissipating means placed at the walls of the radial waveguides.

Moreover, radial amplification devices make it possible to combine several individual amplifiers in a single step. The combination losses are therefore reduced relative to the arborescent combination techniques.

On the other hand, a current limitation of these solutions arises from the fact that there is no simple and effective system for compensating for the phase dispersion of the various combined amplifying channels at the time of recombination of the output signal. This drawback makes it necessary to sort the amplifying channels on the basis of the phase of the transmission coefficient or makes it necessary to add variable phase shifters on the amplifying channels in order to compensate for the phase dispersion of the amplifying channels. The latter solution is complex to apply, cumbersome, introduces new losses and optionally consumes additional power.

SUMMARY OF THE INVENTION

One object of the invention is to alleviate the aforementioned drawbacks.

The invention proposes a radial amplification device comprising means for adjusting the positioning of the amplifying channels so as to adjust the phase shift of the various channels, which makes it possible to combine an output signal in phase.

Advantageously, the radial power combination system with phase dispersion compensation in the microwave field comprises:

a first radial waveguide, called a radial divider, having an input in its center and a plurality of outputs on the periphery, each of the outputs being a metal waveguide, the first radial waveguide making it possible to divide one input signal into several output signals;

a second radial waveguide, called a radial combiner, superposed on the radial divider, having an output at its center and a plurality of inputs on the periphery, each of the inputs being a metal waveguide, the second radial waveguide making it possible to combine a plurality of input signals into one output signal;

a first, input transition transmitting a first signal in the radial divider;

a second, output transition capturing the first signal amplified to the output of the radial combiner;

a plurality of amplifying channels, each comprising:
  a third, input transition capable of interacting with one of the metal waveguides of the radial divider and;
  a fourth, output transition capable of interacting with one of the metal waveguides of the radial combiner and;
  at least one amplifier secured to the third and fourth transitions.

Advantageously, the system comprises means for adjusting the positioning of at least one amplifying channel in the metal waveguides.

Advantageously, the adjustment means comprise a set of spacers.

Advantageously, each amplifying channel comprises fixing means making it possible to fix each amplifying channel to the combiner and to the divider with a spacer.

Advantageously, the set of spacers contributes to the transfer of heat between the amplifying channels and the radial waveguides.

Advantageously, shells cover the amplifying channels and promote heat exchange between the amplifiers and the outside of the system.

Advantageously, the metal waveguides of the outputs of the divider and of the inputs of the combiner are straight so that the connection of the amplifying channels is carried out in the radial axis.

Advantageously, the metal waveguides of the outputs of the divider and of the inputs of the divider are bent so that the connection of the amplifying channels is carried out perpendicular to the radial axis.

Advantageously, the radial divider and the radial combiner comprise absorbent materials or dissipating means for isolation between the channels.

Advantageously, the metal waveguides on the periphery of the two radial waveguides are rectangular waveguides.

Advantageously, the input of the divider and/or the output of the combiner are cylindrical waveguides.

Advantageously, the input of the divider and/or the output of the combiner are coaxial waveguides.

Advantageously, at least one transition comprises a central core in contact with the lower portion of a radial waveguide.

Advantageously, at least one port of a coaxial waveguide centered on the radial waveguide is designed to receive a coaxial connector, a centering ring, a central core and this port is partly extended into the radial waveguide by an outer conductor in the form of a cone directly machined in the upper cap.

Advantageously, the transition between the rectangular-waveguide propagation mode and the microwave-stripper propagation mode comprises:

metallizations the profile of which is in cosine with a zero gradient at the rectangular waveguide end of the transition and;

a substrate cut according to the cosine profile of the metallizations so as to minimize the reflection coefficient of the transition.

BRIEF DESCRIPTION OF THE DRAWINGS

Other features and advantages of the invention will become evident in the following description given with reference to the appended drawings which represent.

DETAILED DESCRIPTION

In the following description, a "transition" is any device which allows the transition of an electromagnetic wave from one propagation structure to another with the minimum of transmission losses such as, for example, a coaxial line to a radial waveguide, or a rectangular waveguide to one or more planar lines of the microwave strip type, coplanar, slot, or any other medium.

Figure 1:
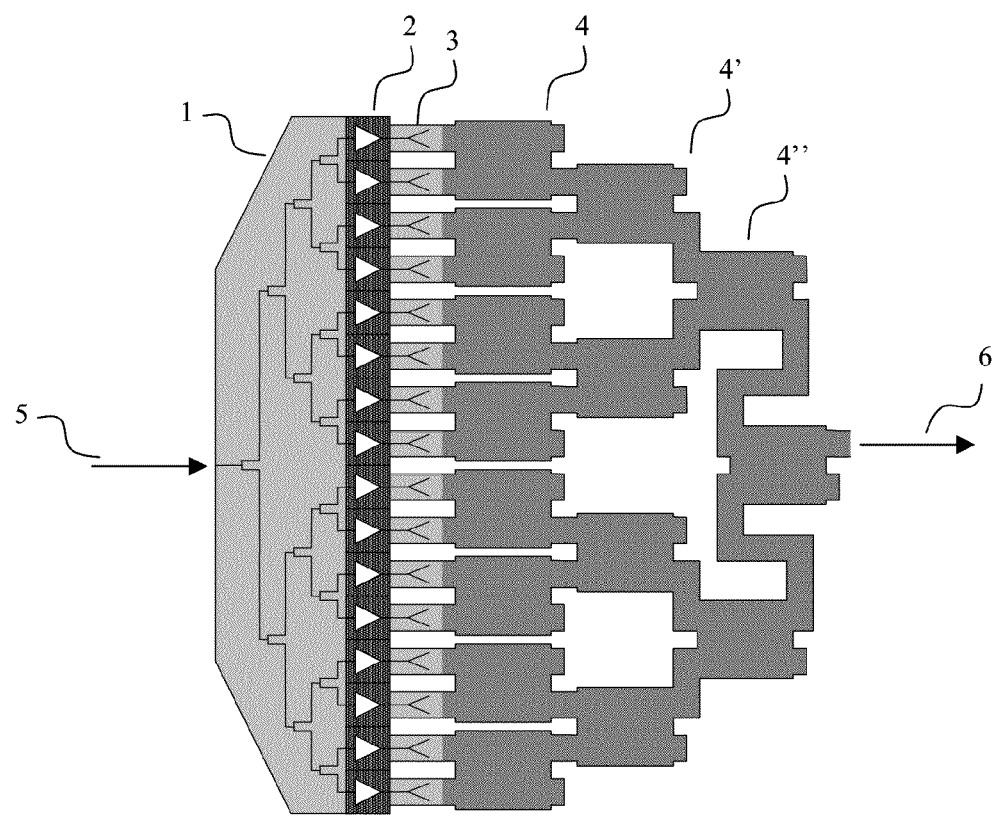
FIG. 1: an amplification device with an arborescent structure according to the prior art.
Figure 2A:
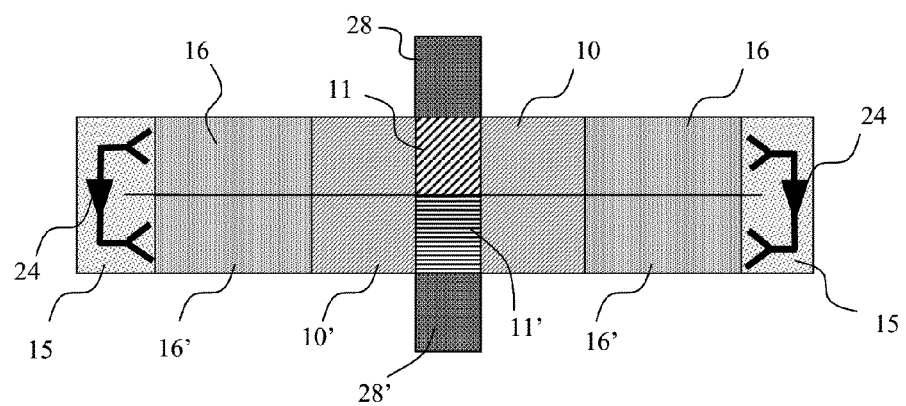
FIG. 2A: a representation of a radial amplification device.
Figure 2B:
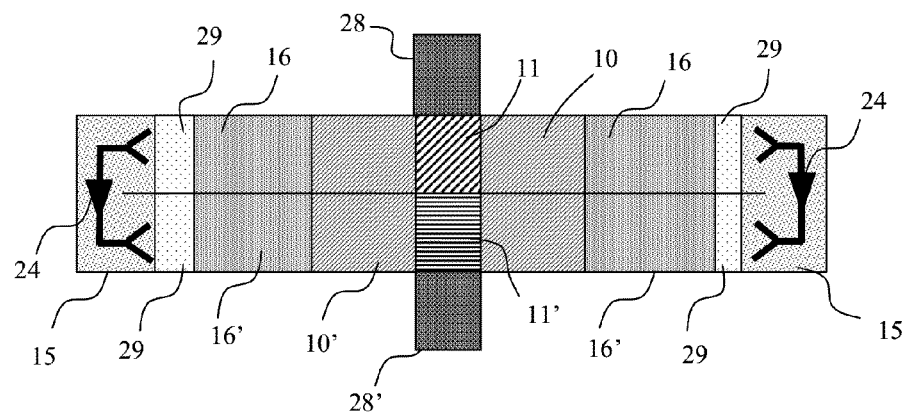
FIG. 2B: a representation of a radial amplification device comprising a set of spacers.

FIGS. 2A and 2B illustrate a representation in the form of blocks in a section through a device of the prior art and of an amplification device according to the invention, respectively.

The device comprises a divider containing a first radial waveguide 10 which an input signal enters by means of a transition 11, the transition 11 propagating the signal between a port 28, of the coaxial waveguide, cylindrical waveguide or rectangular waveguide type, for example, and the radial waveguide 10.

The divider of the amplification device comprises, in the example of FIG. 2B, a radial waveguide 10 with ports in the form of rectangular waveguides 16 on the periphery. The divided signals are propagated in each of the rectangular waveguides 16 in order to reach the input transitions of the amplifying channels 15 plugged in or connected depending on the production methods into the rectangular waveguides in order to be fixed therein. The amplifying channels 15 make it possible to capture the signals originating from the rectangular waveguides 16, in order to amplify them by virtue of an amplifier 24, and to transmit them into the rectangular waveguides 16' so that the signals are recombined in the combiner 10'. The combined signals are transmitted to the outside of the device via a transition 11' propagating the signal between the radial waveguide 10' and a second port 28' of the coaxial waveguide, cylindrical waveguide or rectangular waveguide type, for example.

Figure 3A:
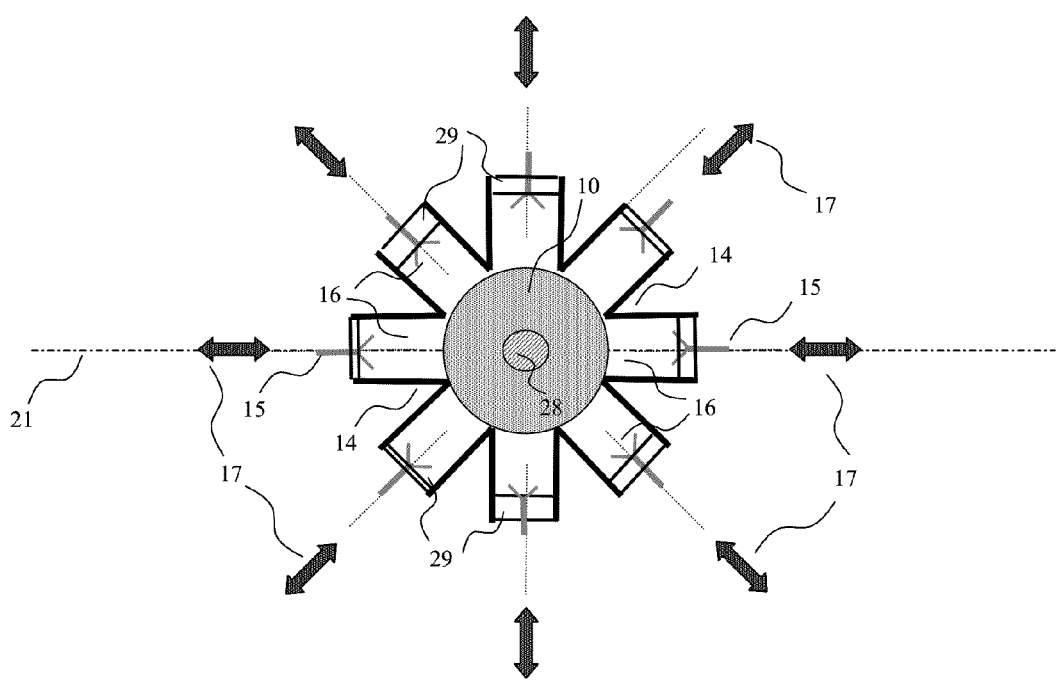
FIG. 3A: a top view of a radial amplification device according to the invention.

The amplifying channels 15 can be plugged in or fixed by means of a fixing device to the rectangular waveguides 16 and 16' in a direction 17 specified in FIG. 3A.

For example, spacers 29 can be added, as illustrated in FIG. 2B, between the amplifying channels 15 and the rectangular waveguides 16, 16'. The latter can be advantageously of different thicknesses depending on the channels of the rectangular waveguides 16, 16' in order to adapt to the phase shift specific to each amplifying channel 15.

Figure 2C:
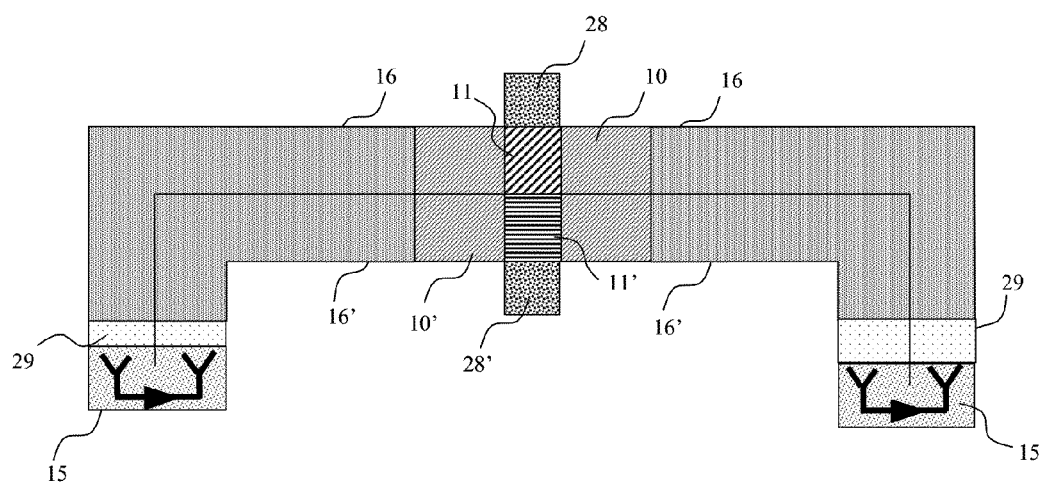
FIG. 2C: a representation of a bent radial amplification device comprising a set of spacers.

In another embodiment shown in FIG. 2C, the rectangular waveguides 16, 16' can be bent, for example at 90° so that the connection of the amplifying channels 15 takes place in the direction of the axes of the transitions 11, 11'.

In the rest of the description, a channel comprising at least one transmit transition, one receive transmission and at least one amplifier will be called an amplifying channel.

The invention applies more generally, beyond the embodiment described, to ports in the form of metal waveguides on the periphery of the radial waveguide.

FIG. 3A represents a top view of a device according to the invention comprising a divider including a first radial waveguide 10 through which an input signal enters via a transition 11 (not shown in this figure) transmitting a signal originating from a port 28.

The divider of the amplification device comprises, in the example of FIG. 3A, a radial waveguide 10 with ports in the form of rectangular waveguides 16 on the periphery. In this embodiment, the device according to the invention has eight rectangular waveguides placed symmetrically at the periphery of the radial waveguide 10. The divided signals are propagated in each of the rectangular waveguides in order to reach the input transitions of the amplifying channels 15 plugged in and connected to the rectangular waveguides.

The amplification device according to the invention makes it possible to have means 29 for adjusting the position of each of the transitions in the rectangular waveguides 16. These adjustment means 29 in an embodiment shown in FIG. 3A are sets of spacers which can be produced by adaptation rectangular waveguides 29.

Advantageously, the portion 14 forming an angle at the intersection of two rectangular waveguides 16 allows the signals to be fully distributed into the various ports in the form of metal waveguides.

The device according to the invention comprises a combiner superposed on the divider comprising a radial waveguide with ports in the form of rectangular waveguides, but it is not shown in the top view of FIG. 3A.

Figure 3B:
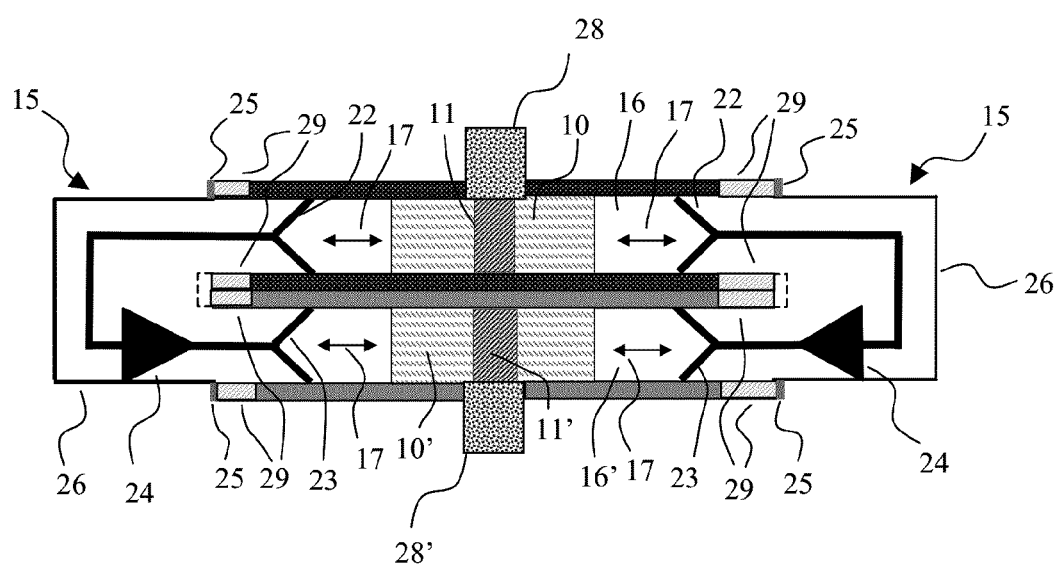
FIG. 3B: a view in section of the radial amplification device of FIG. 3A.

FIG. 3B shows the amplification device of FIG. 3A in the sectional plane along the axis 21. The latter comprises two superposed radial waveguides 10, 10' which interact with rectangular waveguides 16 and 16', respectively, placed on the periphery.

A transition 11 transmits the signal originating from the port 28 in the radial waveguide 10. The port 28 can be a cylindrical waveguide, a coaxial waveguide or else a rectangular waveguide depending on the embodiment of the invention. The geometry of the radial waveguide 10 and that of the rectangular waveguides 16 make it possible to distribute the transmitted signal into each of the rectangular waveguides 16.

The device also comprises the amplifying channels 15 which are plugged in or connected and fixed with the aid of fixing means depending on the embodiment. Each of the amplifying channels 15 comprises a received transition 22 propagating a signal from a rectangular waveguide into a planar propagation line, of the microwave strip type for example. Moreover, each amplifying channel 15 comprises at least one amplifier 24 and a transition 23 for transmitting the amplified signal. In the same manner as the receive transition, the transmit transition 23 can be a simple transition of a planar propagation line, of the microwave strip type for example, in a rectangular waveguide.

The combiner comprises a radial waveguide 10', which can be called a radial combiner, with ports in the form of rectangular waveguides on the periphery. The radial waveguide 10' receives each signal originating from each amplifying channel 15 which is propagated by means of rectangular waveguides 16'. The radial waveguide 10' makes it possible to transmit the combined output signals to the port 28' via the transition 11'.

The main advantage of the solution of the invention is that it makes it possible to adjust the phases of the various signals originating from the rectangular waveguides 16' which are recombined in the radial waveguide 10'. This adjustment is made with the aid of means for adjusting the depth to which the amplifying channels 15 are placed in the rectangular waveguides 16 and 16'.

Figure 4A:
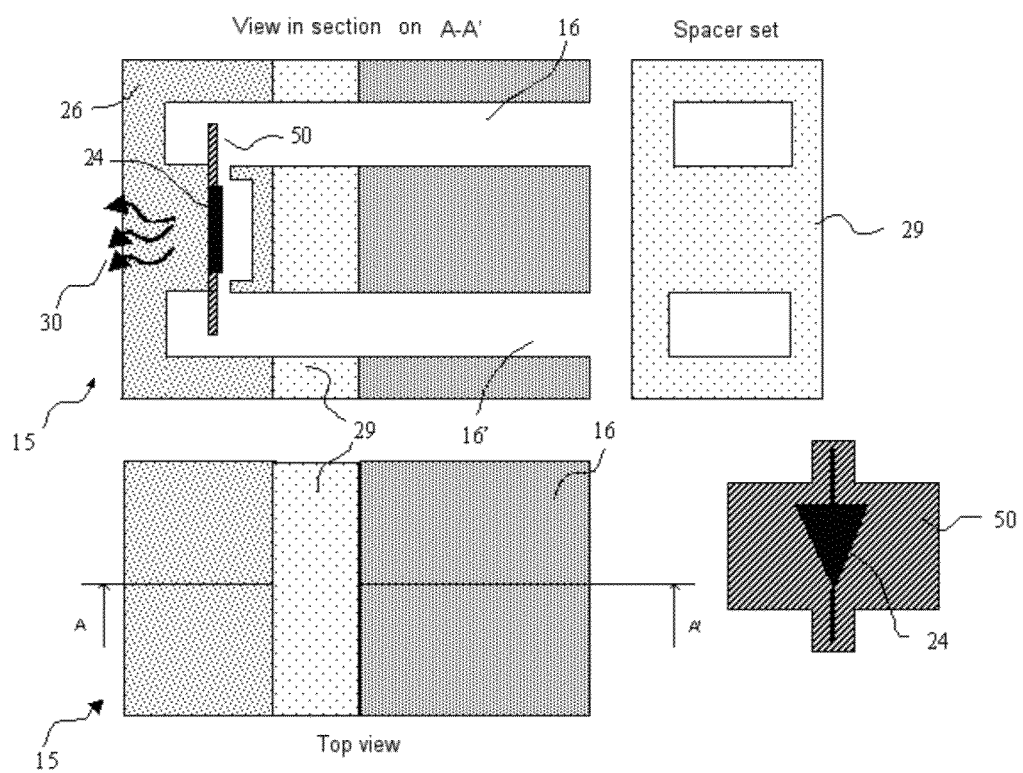
FIG. 4A: a first variant embodiment of the amplifying channel and of the means for adjusting the position.
Figure 4B:
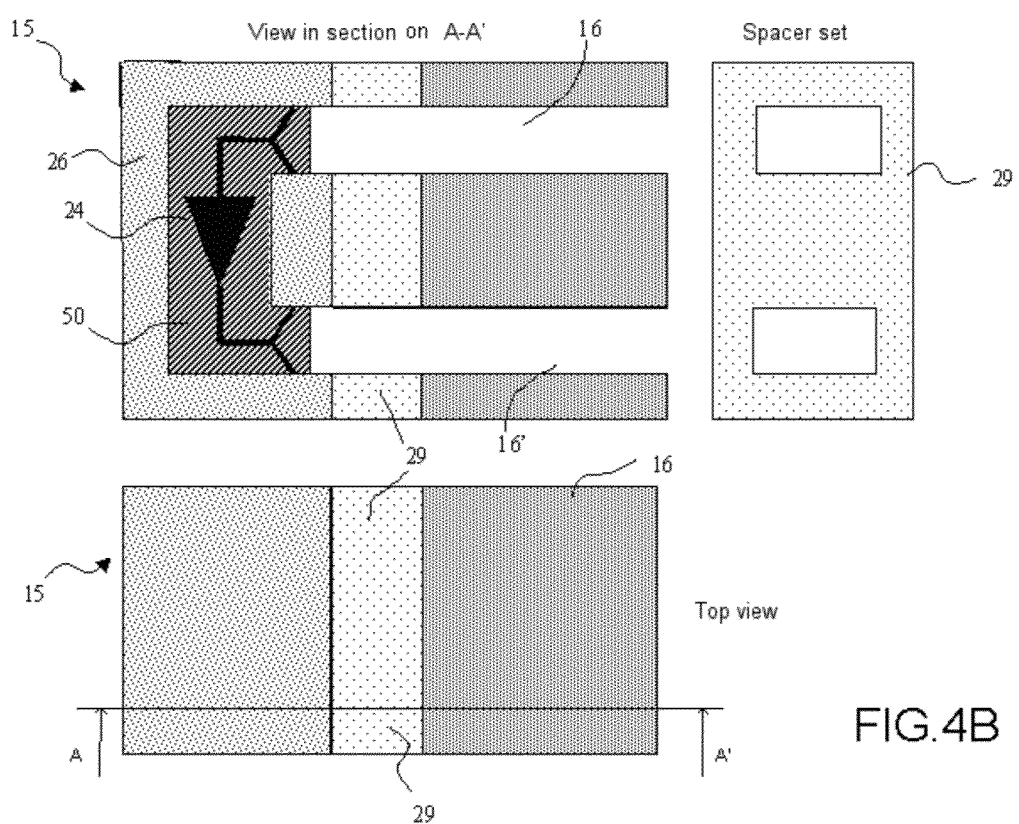
FIG. 4B: a second variant embodiment of the amplifying channel and of the means for adjusting the position.
Figure 4C:
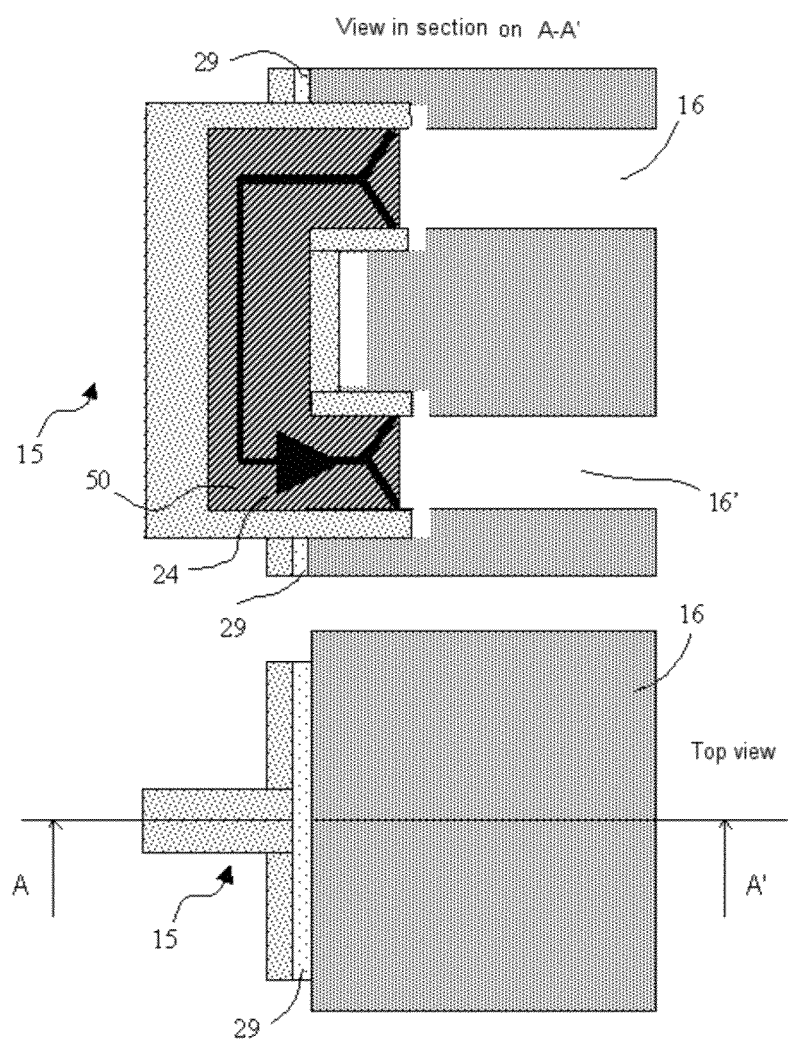
FIG. 4C: a third variant embodiment of the amplifying and of the means for adjusting the position.

In a variant embodiment, these means can be spacers 29 of abutments interacting with the rectangular waveguides 16 and 16' in the form of a rectangular adaptation waveguide as shown in FIG. 4C.

The spacers can be chosen as a function of the phase shift introduced by the amplifying channels 15.

Another advantage is the ability to test the amplifying channels 15 separately in two superposed rectangular waveguides so as to ascertain their characteristics before they are installed in the amplification device.

Measuring the phase shift introduced by the amplifying channels makes it possible to determine the position of each amplifying channel in the rectangular waveguides 16, 16' so that all the amplifying channels are recombined in phase.

A shell 26 can advantageously cover the amplifying channel and fixing means 25 represented by an abutment in FIG. 3B.

The amplifiers 24 can advantageously be in contact with the shell 26 in order to promote the heat exchanges between the amplifiers and the outside of the system.

The device according to the invention, in other embodiments, makes it possible to increase the number of combined amplifiers. Three solutions can be employed simultaneously or independently.

The first solution consists in increasing the number of ports in the form of rectangular waveguides. The second solution is to increase the number of amplifiers for each amplifying channel. Finally, a third solution consists in increasing the number of amplifying channels that can be plugged into each rectangular waveguide.

The device according to the invention proposes to improve the isolation between the channels of the combiner and of the divider by advantageously placing in the combiner and the divider absorbent materials or dissipative means as described for example in U.S. Pat. No. 4,263,568. This improvement makes the amplifying channels more independent.

The advantages of the device according to the invention and notably of the embodiment explained is that it has a low phase dispersion of the passive portions, that it introduces low combination losses and that it allows ranges of use that can extend from the centimeter bands to the millimeter bands.

Moreover, there are advantages in that the amplifying channels are easily removable, that they can comprise both the amplifier and the transitions and finally that they can be characterized easily, notably by the intrinsic parameter of the phase shift introduced by the amplifying channel.

Moreover, the compactness of the device makes it possible to produce an assembly with a small footprint while retaining effective management of the thermal constraints.

FIGS. 4A, 4B and 4C illustrate various embodiments notably of the amplifying channel 15 making it possible to incorporate the amplifier 24 and to produce the transmit and receive transitions by means of metal lines on a substrate 50. The amplifying channels 15 can be connected to the waveguides 16, 16' as illustrated in FIGS. 4A and 4B or plugged into the rectangular waveguides as illustrated in FIG. 4C.

In these variant embodiments, the sets of spacers 29 can be simple abutment spacers as illustrated in FIG. 4C or else adaptation rectangular waveguides as shown in FIG. 4A.

In a preferred embodiment, these sets of spacers allow effective heat exchange between the amplifying channels and the ports of the radial waveguides capable of dissipating the heat over a large surface area. Moreover, the positioning of the amplifying channels on the periphery of the structure makes it possible to envisage also getting rid of the dissipated power via the periphery.

FIG. 4A illustrates the advantageous use of the shell (26) in order to promote the heat exchange (30) between the amplifier and the outside of the system.

Figure 5A:
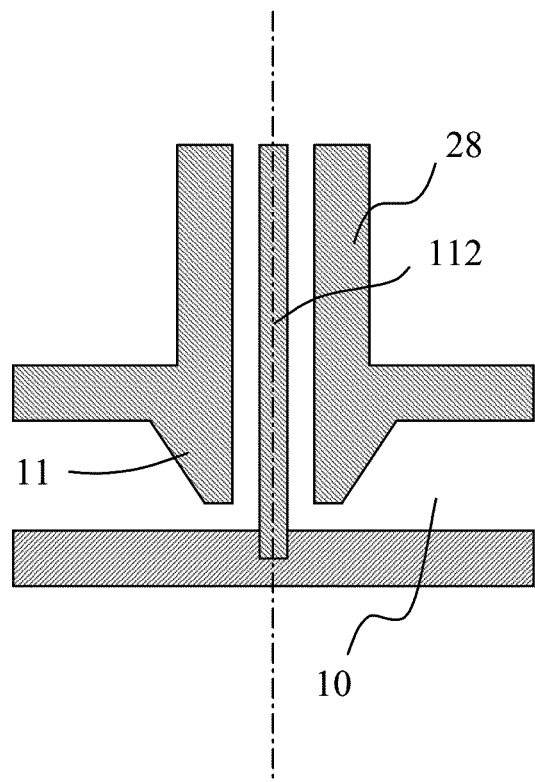
FIG. 5A: a view in section of an example of a transition between a coaxial waveguide and a radial waveguide.

FIG. 5A illustrates a view in section of an example of a transition 11 between a coaxial port 28, also called a coaxial connector, and a radial waveguide 10.

Figure 5B:
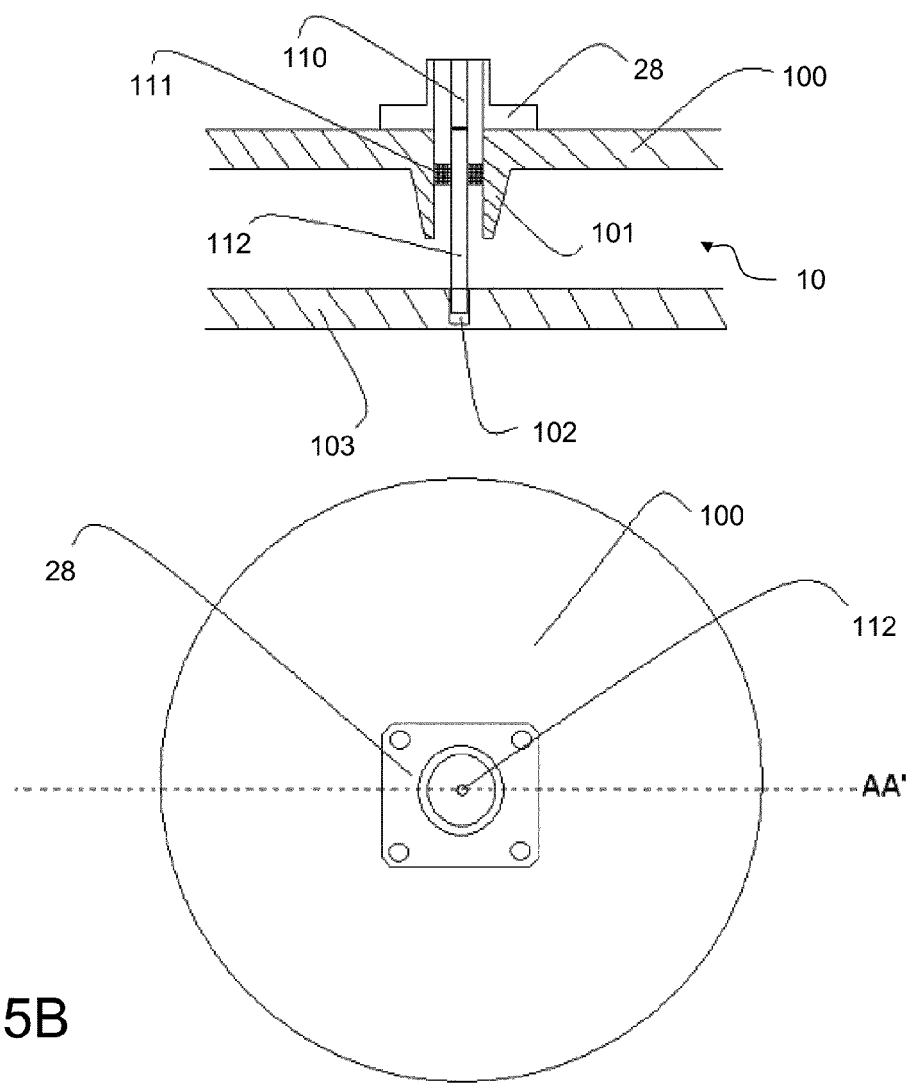
FIG. 5B: a view in section and a top view of an embodiment of a transition between a coaxial waveguide and a radial waveguide.

FIG. 5B is an exemplary embodiment of a transition like that of FIG. 5A.

The transition between the coaxial port and the radial waveguide consists of two metal portions: an upper cap 100 and a lower cap 103 which form a radial waveguide 10. The coaxial waveguide centered on the radial structure is partly extended in the radial waveguide 10 by an outer conductor 101 in the form of a cone machined directly in the upper cap 100. The coaxial waveguide thus formed has the same internal dimensions as those of the coaxial connector 28 fixed to the upper cap 100. The central core 110 of the extended coaxial connector is made by a metal stem 112 inserted, on the one hand, into the portion 110, called the female portion, of the coaxial connector 28 and, on the other hand, into a receptacle 102 provided in the lower cap 103 of the radial waveguide 10. The diameter of the metal stem 112 must also be the same as that of the core 110 of the connector 28. There is therefore no change in the dimensions of the coaxial portion during the passage from the connector 28 to the coaxial waveguide extending into the radial waveguide 10. This continuity of dimensions makes it possible to ensure optimal adaptation performance of the transition.

The precise positioning of the core at the center of the structure is ensured on the one hand by its receptacle 102 in the lower cap 103 and on the hand by a dielectric ring 111 inserted into the cone 101. However, if this ring is made of a dielectric of which the permittivity is different from that of air, or vacuum or of the material contained in the transition, discontinuities in the diameter of the outer conductor and/or the diameter of the central core of the coaxial waveguide may be introduced in order to compensate for this difference in permittivity.

A sufficient vertical pressure on the metal stem 112, also called the core, for its insertion into the female portion 110 of the connector 28 can be maintained by inserting a spring or a compressible material into the hole 102 of the lower cap 103.

This transition, illustrated in FIG. 5B, makes it possible:
to simplify the machining of the central core and improve the accuracy of the geometric dimensions; it therefore makes it possible to reduce the mis-adaptation during the passage of the wave from the connector into the structure;
to obtain a good adaptation over a broad band of frequencies by virtue of the progressive adaptation achieved by the cone 101 machined on the upper cap 100;
to relax the constraints associated with the machining of a profile of complex shape on the outer conductor of the coaxial by virtue of the use of a straight-line cone;
to obtain a perfect symmetry of revolution by virtue of the various systems for positioning the central core and the connector 110;
to produce a transition from a coaxial to a radial waveguide of any height by re-optimizing the two geometric dimensions of the cone, that is to say the height and the width of the base;
to obtain a good power behavior of the device, the central core of the coaxial being in contact with the bottom of the structure (the lower cap 103).

The incorporation of this transition into the divider and/or the combiner makes it possible:
to relax the constraints associated with the machining, the waveguides being machined in the lower cap 103 and the cone 101 in the upper portion 100;
to achieve, with a transition with a reduced footprint of the cone 101, the adaptation between a coaxial and a radial waveguide of which the height corresponds to the height of the rectangular waveguides present on the periphery of the structure.

The amplifying channels of the device according to the invention make it possible to amplify a signal captured by transitions 22 and to re-inject them after amplification into the rectangular waveguides 16 via transitions 23. These transitions have advantageous features in the device according to the invention and can be produced, for example, according to FIGS. 6A and 6B.

Figures 6A, 6B:
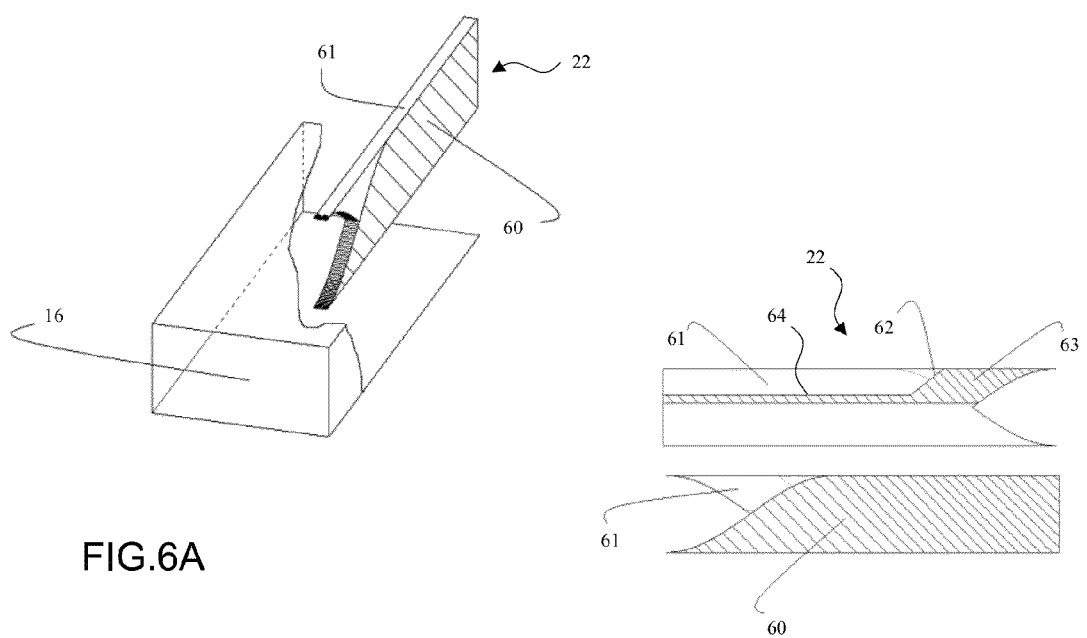
FIGS. 6A and 6B: an embodiment of a transition between a rectangular waveguide and a microwave strip line.

The transition of the rectangular waveguide 16 to a microwave strip line 64, shown in FIGS. 6A and 6B in different views, consists of circuits placed inside a rectangular waveguide and parallel to the propagation of the electric field of the dominant mode. The support for this circuit is a substrate 61 of any permittivity on which a metal plane 60 and a metal line 63 are engraved on either side. The metal plane 60 is traced in the shape of a cosine of zero gradient at the rectangular waveguide 16 end of the transition 22. The height of the cosine corresponds to the height of the rectangular waveguide 16 and its length is to be determined by optimization. The metal line 63 traced on the other face also comprises a cosine portion. The length of the latter portion is also determined by optimization. The parameters, notably the "period" and the "height", used for tracing the cosines of the metal plane 60 and of the metal line 63 are the same. The segment 62 linking the microwave strip line 64 to the top portion of the transition 22 is produced in a straight line but may be produced in an arc of a circle, cosine or other. The position of the line and the geometric values of this segment 62 are to be determined by optimization. The cutting of the substrate 61 is achieved by following the cosine profiles of the line and of the metal plane 60, as close as possible to the metallizations.

In one embodiment comprising several circuits, the transitions can be placed parallel with one another in a rectangular waveguide in order to achieve a transition from a waveguide 16 to several microwave strip lines.

Figure 6C:
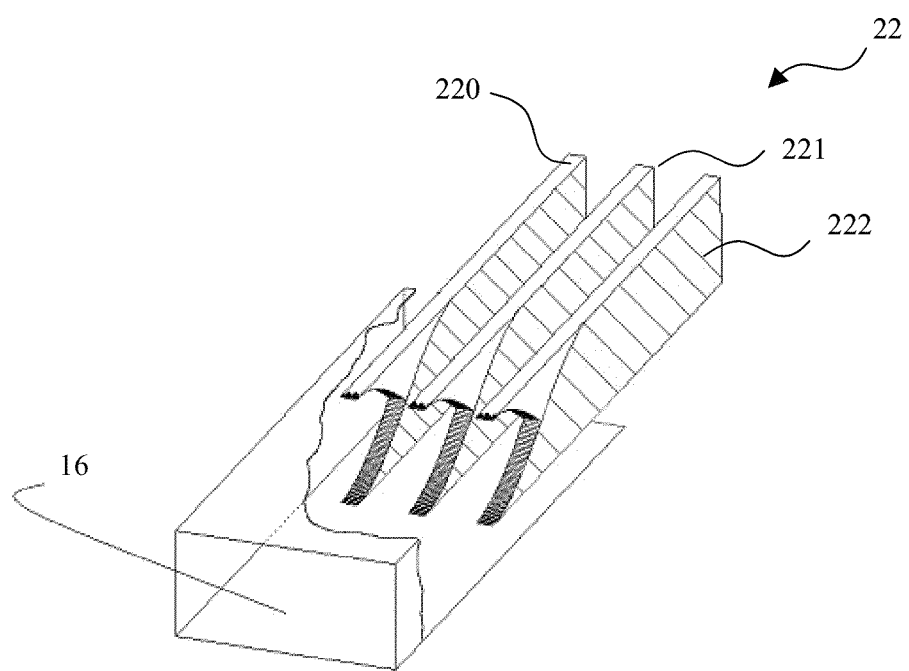
FIG. 6C: an embodiment of a transition comprising several circuits in order to achieve a transition between a rectangular waveguide and microwave strip lines.

FIG. 6C shows a case of a transition from three microwave strip lines to a rectangular waveguide consisting of three circuits 220, 221 and 222 positioned in parallel.

This type of transition makes it possible:
- to pass directly from the propagation mode in a rectangular waveguide to a propagation mode of the microwave strip type;
- to minimize losses by removing an intermediate transition and thus to allow a reduction in the complexity of production;
- to obtain a reduced footprint through the use of cosine profiles on the line and the metal plane having a zero gradient at the rectangular waveguide end of the transition;
- to obtain a broad bandwidth and a good level of adaptation;
- to obtain a very low reflection coefficient at the input of the structure, seen from the rectangular waveguide, even when several circuits are present in the waveguide.

The incorporation of this structure into the complete combiner makes it possible:
- to reduce its footprint;
- to maximize its performance.

What is claimed is:

1. A radial power combination system with phase dispersion compensation in a microwave field, comprising:
    a first radial waveguide, being a radial divider, having an input in its center and a plurality of outputs on its periphery, each of the outputs being a metal waveguide, the first radial waveguide configured to divide one input signal into several output signals;
    a second radial waveguide, being a radial combiner, superposed on the radial divider, having an output at its center and a plurality of inputs on its periphery, each of the inputs being a metal waveguide, the second radial waveguide configured to combine a plurality of input signals into one output signal;
    a first, input transition transmitting a first signal in the radial divider;
    a second, output transition capturing the first signal amplified to the output of the radial combiner;
    a plurality of amplifying channels, each comprising:
        a third, input transition configured to interact with one of the metal waveguides of the radial divider,
        a fourth, output transition configured to interact with one of the metal waveguides of the radial combiner,
        at least one amplifier secured to the third and fourth transitions; and
    means for adjusting a positioning of at least one amplifying channel in the metal waveguides.

2. The system as claimed in claim 1, wherein the means for adjusting comprises a set of spacers.

3. The system as claimed in claim 1, wherein each amplifying channel comprises fixing means to fix each amplifying channel to the radial combiner and to the radial divider with a spacer.

4. The system as claimed in claim 2, wherein the set of spacers contributes to a transfer of heat between the amplifying channels and the first and second radial waveguides.

5. The system as claimed in claim 1, wherein shells cover the amplifying channels to promote heat exchange between the at least one amplifier and the outside of the system.

6. The system as claimed in claim 1, wherein the metal waveguides of the outputs of the radial divider and of the inputs of the radial combiner are straight so that a connection of the amplifying channels is carried out in a radial axis.

7. The system as claimed in claim 1, wherein the metal waveguides of the outputs of the radial divider and of the inputs of the radial divider are bent so that a connection of the amplifying channels is carried out perpendicular to a radial axis.

8. The system as claimed in claim 1, wherein the radial divider and the radial combiner comprise absorbent materials or dissipating means for isolation between the amplifying channels.

9. The system as claimed in claim 1 wherein the metal waveguides on the periphery of the first and the second radial waveguides are rectangular waveguides.

10. The system as claimed in claim 1, wherein the input of the radial divider and/or the output of the radial combiner are cylindrical waveguides.

11. The system as claimed in claim 1, wherein the input of the radial divider and/or the output of the radial combiner are coaxial waveguides.

12. The system as claimed in claim 11, wherein at least one transition comprises a central core in contact with a lower portion of a radial waveguide.

13. The system as claimed in claim 12, wherein at least one port of a coaxial waveguide centered on the radial waveguide is designed to receive a coaxial connector, a centering ring, a central core, the at least one port is partly extended into the radial waveguide by an outer conductor as a cone directly machined in an upper cap of the radial waveguide.

14. The system as claimed in claim 9 further comprising:
    a transition between a rectangular-waveguide propagation mode of a rectangular waveguide and a microwave-stripper propagation mode of a microwave strip line, the transition comprises:
    metallizations having a profile in cosine with a zero gradient at the rectangular waveguide end of the transition; and
    a substrate cut according to the cosine profile of the metallizations to minimize a reflection coefficient of the transition.

* * * * *